United States Patent [19]
Lu et al.

[11] Patent Number: 5,963,808
[45] Date of Patent: Oct. 5, 1999

[54] METHOD OF FORMING AN ASYMMETRIC BIRD'S BEAK CELL FOR A FLASH EEPROM

[75] Inventors: Wenpin Lu, I-Lan; Tao-Cheng Lu, Kaohsiung; Mam-Tsung Wang, Hsinchu, all of Taiwan

[73] Assignee: Macronix International Co., Ltd., Taiwan

[21] Appl. No.: 08/783,995

[22] Filed: Jan. 15, 1997

[51] Int. Cl.[6] .................................................. H01L 21/336
[52] U.S. Cl. ......................... 438/286; 438/305; 438/263; 438/303
[58] Field of Search ..................... 438/257, 262, 438/263, 264, 286, 211, 287, 301, 303, 305, 306, 410, 595

[56] References Cited

U.S. PATENT DOCUMENTS

| | | | |
|---|---|---|---|
| 4,852,062 | 7/1989 | Baker et al. | 438/286 |
| 5,021,848 | 6/1991 | Chiu | 438/264 |
| 5,060,195 | 10/1991 | Gill et al. | 365/185 |
| 5,077,230 | 12/1991 | Woo et al. | 438/264 |
| 5,306,658 | 4/1994 | Gill | 438/286 |
| 5,352,619 | 10/1994 | Hong | 438/263 |
| 5,384,272 | 1/1995 | Ibok et al. | 438/262 |
| 5,403,764 | 4/1995 | Yamamoto et al. | 438/257 |
| 5,510,284 | 4/1996 | Yamauchi | 438/286 |
| 5,837,584 | 11/1998 | Lu et al. | 438/286 |

*Primary Examiner*—Charles Bowers
*Assistant Examiner*—Jack Chen
*Attorney, Agent, or Firm*—Haynes & Beffel LLP

[57] ABSTRACT

A memory cell having an asymmetric source and drain connection to buried bit-lines providing a Fowler-Nordheim tunneling region and a non-tunneling region defined by a bird's beak encroachment on each of the cells. A nonvolatile semiconductor memory device comprising row and column arrangement of the cells in which adjacent columns of cells share a single bit-line. The method for manufacturing a memory cell having asymmetric source and drain regions and comprising the steps of: (1) forming a dielectric covering a semiconductor substrate of a first conductivity type; (2) forming a column of floating gates on the dielectric; (3) forming an inhibit mask adjacent a first side of the column of floating gates; (4) implanting a dopant adjacent the first side and a second side of the column of floating gates, the first dopant having a second conductivity type opposite the first conductivity type; (5) forming a thermal oxide adjacent the first and second side of the column of floating gates such that the dopant adjacent the first side of the column is separated from the floating gates by the dielectric and the dopant adjacent the second side of the column is separated from the floating gates by a bird's beak encroachment of the thermal oxide formation; and (6) completing formation of control gate dielectric and control gates.

4 Claims, 17 Drawing Sheets

METHOD OF FORMING AN ASYMMETRIC BIRD'S BEAK CELL FOR A FLASH EEPROM

RELATED APPLICATION DATA

The present application is related to Virtual Ground Flash Cell with Asymmetrically Placed Source and Drain and Method of Fabrication, by inventors Wenpin Lu and Mam-Tsung Wang, application No. 08/783,994, Attorney Docket No. 17538.859, filed on Jan. 15, 1997, which is incorporated by reference as if fully set forth herein.

BACKGROUND OF INVENTION

1. Field of the Invention

The field of the present invention relates to a nonvolatile semiconductor memory device and a manufacturing method therefor, and more particularly to an electrically programmable metal-oxide-semiconductor (MOS) type nonvolatile semiconductor memory device having an asymmetric source and drain and a manufacturing method therefor.

2. Description of Related Art

Flash memories are a growing class of nonvolatile storage integrated circuits. Flash memories have the capability of electrically erasing, programming, and reading a memory cell in the chip. A flash memory cell is formed using so-called floating gate transistors in which the data are stored in a cell by charging or discharging the floating gate. The floating gate is a conductive material, typically polysilicon, which is insulated from the channel of the transistor by a thin layer of oxide, or other insulating material, and insulated from the control gate or word-line of the transistor by a second layer of insulating material.

Data are stored in the memory cell by charging or discharging the floating gate. The floating gate is charged through a Fowler-Nordheim (FN) tunneling mechanism by establishing a large positive voltage between the gate and source or drain. This causes electrons to be injected into the floating gate through the thin insulator. Alternatively, an avalanche injection mechanism may be used by applying potentials to induce high energy electrons in the channel of the cell. The electrons are injected across the insulator to the floating gate. When the floating gate is charged, the threshold voltage for causing the memory cell channel to conduct is increased above the voltage applied to the word-line during a read operation. Thus, when a charged cell is addressed during a read operation, the cell does not conduct. The non-conducting state of the cell can be interpreted as a binary 1 or 0 depending on the polarity of the sensing circuitry.

The floating gate is discharged to establish the opposite memory state. This function is typically carried out by a FN tunneling mechanism between the floating gate and the source or the drain of the transistor, or between the floating gate and the substrate. For instance, the floating gate may be discharged through the source by establishing a large positive voltage from the source to the gate, while the drain is left at a floating potential.

A popular architecture for flash memories is the Divided NOR structure (DINOR) in which the drain of each cell is connected to a bit-line and the source of adjacent columns of cells share a bit-line. A drawback to the DINOR structure is that a cell which shares both a word-line and a bit-line with a cell being programmed, may be susceptible to a disturb condition arising from either FN tunneling or hot electron injection during programming. This results in an unacceptable memory loss.

The major challenge of flash memory design is to improve programming speed while maintaining disturb resistance. Traditionally, the disturb problem has been dealt with by providing asymmetric diffusions on the source and drain side of the cell. The drawback to these approaches is that they are not suitable for small scale memory arrays.

To realize further reductions in array size, it would be desirable to find new solutions to the disturb problems that do not involve the added complexity and space required by asymmetric bit-lines. What is needed is a way to increase programming speed and reduce the source disturbance at the same time.

SUMMARY OF THE INVENTION

The present invention provides a nonvolatile semiconductor memory device and a manufacturing method therefore. A memory cell is disclosed in which asymmetric source and drain regions in a semiconductor substrate are aligned with a floating gate above the semiconductor substrate. On the source side of the cell, a bird's beak encroachment of a thermal oxide creates a non-tunneling region between the source and the floating gate. Source disturbance is inhibited by thicker tunnel oxide at the source side because the encroachment of the bird's beak. The drain side has no bird's beak encroachment. A thin tunneling region provides for high programming speed on the drain side of the cell. The memory is capable of affecting the programming, erasing and read operations of a memory cell while reducing disturbance of a cell adjacent to the one being programmed, erased or read.

To achieve the foregoing, there is provided a memory on a semiconductor substrate. A dielectric is provided on the semiconductor substrate. A floating gate comprising a first and a second side is provided on the dielectric. An inhibit mask is provided adjacent the first side of the floating gate. A thermal oxide formation is provided on the semiconductor substrate adjacent the first and second sides of the floating gate. A first diffusion region is aligned horizontally with the first side of the floating gate and separated from the floating gate by the dielectric. The first diffusion extends vertically into the semiconductor substrate. A second diffusion region is aligned horizontally with the second side of the floating gate and is separated from the floating gate by a bird's beak encroachment of the thermal oxide formation. The second diffusion extends vertically into the semiconductor substrate.

In a more general embodiment of the invention, a plurality of bit-lines links adjacent columns of memory cells in a memory array laid out as rows and columns of memory cells. Each memory cell comprises a single floating gate transistor. A dielectric is provided on the semiconductor substrate. An array of floating gates comprising first and second sides and arranged in columns and rows are provided on the dielectric. A plurality of inhibit masks are provided. Each inhibit mask is associated with a selected floating gate and, more specifically, a selected one of the first and second sides thereof. A plurality of thermal oxide formations are provided on the semiconductor substrate adjacent to the first and second sides of a corresponding floating gate. A plurality of first diffusion regions are provided, which are aligned horizontally with one of the first and second sides of the floating gates and separated from the floating gates by the dielectric. The first diffusion regions extend vertically into the semiconductor substrate. A plurality of second diffusion regions are aligned horizontally with another of the first and second sides of the floating gates and separated from the gates by a bird's beak encroachment of the thermal oxide formation. The second diffusion regions extend vertically into the semiconductor substrate. An isolation layer is provided on the array of floating gates. A plurality of word-line conductors are provided on each row of the array of floating gates. The word-line conductors are separated from the floating gates by an isolation layer. The word-lines and floating gates form a plurality of rows of floating gate transistors. A plurality of select circuits have contact with the word-line conductors and diffusions. The select circuits switch current to a word-line conductor and a selected pair of the first and second diffusion regions to program, erase, and read a selected floating gate transistor. Thus, by providing adjacent cells an asymmetric source and drain connection to buried bit-lines a cell and array are disclosed in which the disturb condition between adjacent cells, and columns of cells is substantially reduced.

Further, a manufacturing method for an asymmetric bird's beak encroachment in the above-mentioned nonvolatile semiconductor memory device according to this invention comprises the following steps. A dielectric is formed over a semiconductor substrate of a first conductivity type. Next, a column of floating gate strips is formed on the dielectric. An inhibit mask is formed on a first side of the column of floating gate strips. A dopant is then implanted adjacent both the first side and a second side of the column of floating gate strips. The first dopant has a second conductivity type opposite the first conductivity type. Then, a thermal oxide is formed adjacent the first and second sides of the column of floating gate strips. The dopant adjacent the first side of the column is separated from the floating gate strips by the dielectric. The dopant adjacent to the second side of the column is separated from the floating gate strip by a bird's beak encroachment of the thermal oxide formation. Finally, a control gate dielectric and control gates are formed and the floating gate strips are patterned and etched into separate floating gates to complete the memory device.

The manufacturing method of the present invention results in a high-quality tunneling region on one side of each memory cell, and a low quality thick oxide region resistant to tunneling on the other side. This arrangement makes the cell resistant to a disturb condition resulting from the programming of an adjacent memory cell. The foregoing method also provides for self-aligning dopant implants.

Other aspects and advantages of the present invention can be seen upon review of the figures, the detailed description, and the claims which follow.

BRIEF DESCRIPTION OF THE FIGURES

FIGS. 6A–11A are cross-sectional elevation views taken at FIG. 2 (A—A) and illustrating the steps, following those shown in FIGS. 4–5, in the manufacture of memory cells having an asymmetric bird's beak source and drain and suitable for use in a common ground architecture.

FIGS. 6B–11B are cross-sectional elevation views taken at FIG. 2 (A—A) and illustrating the steps, following those shown in FIGS. 4–5, in the manufacture of memory cells having an asymmetric bird's beak source and drain and suitable for use in a virtual ground architecture.

DETAILED DESCRIPTION

A detailed description of the preferred embodiments of the present invention is provided with respect to the figures. A transistor having an asymmetric source and drain structure resulting from the asymmetric placement of a bird's beak dielectric is disclosed. The transistor is suitable for use in a memory array comprising single transistor memory cells. The asymmetric source and drain structure of the transistor allows fast programming speed to be obtained at a thin tunnel oxide at one of the source or drain of the transistor, while minimizing disturbance at the other of the source or drain because of a thick bird's beak dielectric encroachment. The transistor may be programmed by any of a number of methods including, but not limited to F-N tunneling, and hot electron injection. Based on architecture alone and without the added complexity of asymmetric buried diffusions, the asymmetric transistor of the current invention increases floating gate memory array density and programming speed while reducing the likelihood of a disturb condition.

Asymmetric Bird's Beak Cell

Figure 1:
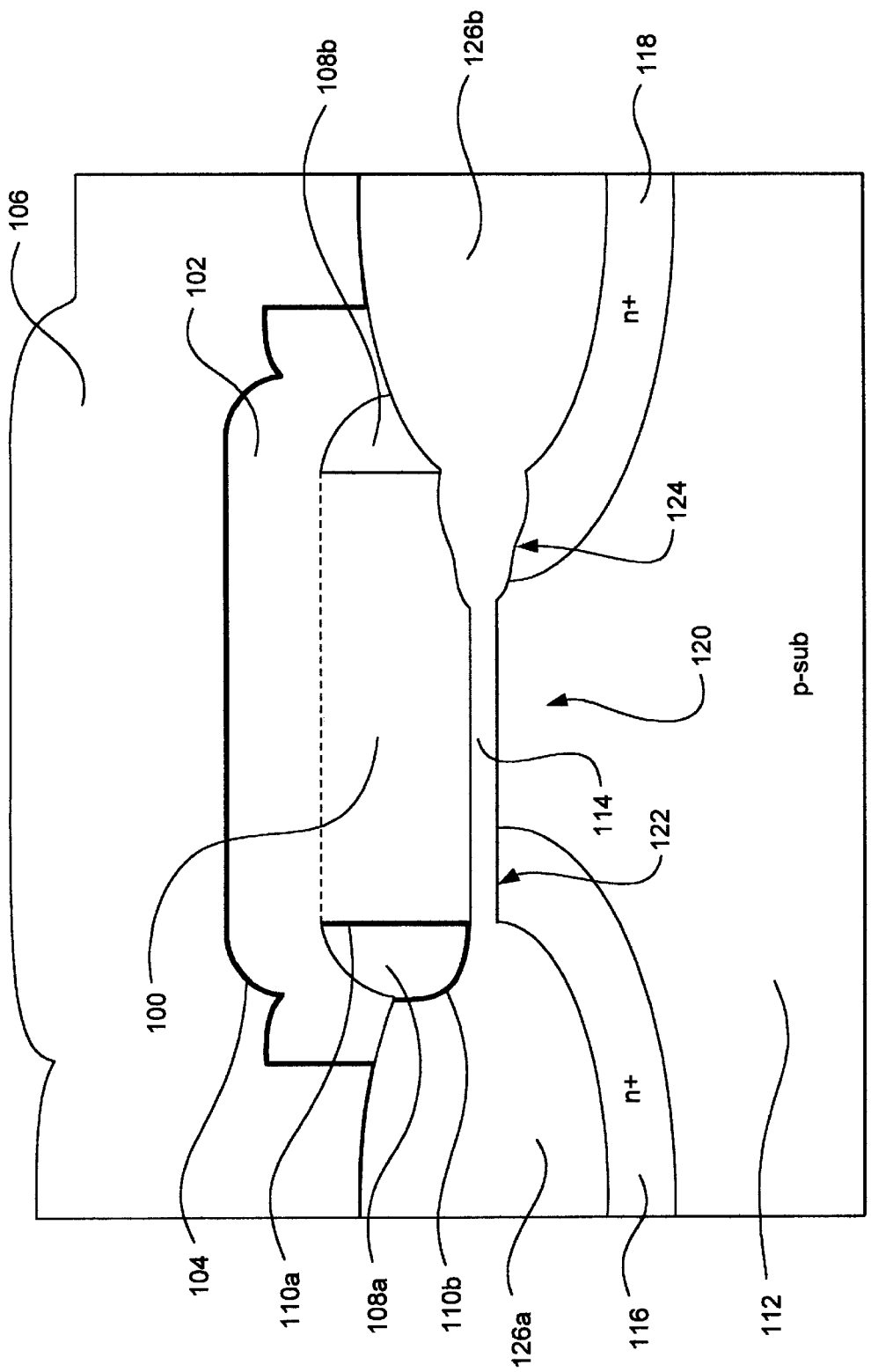
FIG. 1 is an elevation view of a first embodiment of an asymmetric floating gate memory cell.

FIG. 1 provides a detailed cross-section of an embodiment of the asymmetric bird's beak transistor of the current invention. A floating gate core 100 is located between a drain sidewall 108a and a source sidewall 108b. The sidewalls and core are covered by a coupling cap 102. The coupling cap is separated from control gate/word-line 106 by an inter-poly dielectric 104. The floating gate core is separated from a substrate 112 by a thin dielectric 114. Subjacent, the thin dielectric is a substrate 112 in which is defined a buried drain diffusion 116, a buried source diffusion 118, and a channel 120 defined between the source and the drain diffusions. A field oxide 126a separates the floating gate coupling cap from the buried drain diffusion 116. Correspondingly, field oxide 126b separates floating gate coupling cap 102 from buried source diffusion 118.

Inhibit mask 110a–b encompasses a horizontal and vertical portion of drain sidewall 108a. As a result of the inhibit mask, a tunneling region 122 exists between the buried drain diffusion 116 and the floating gate core 100. This tunneling region permits the high speed passage of electrons to and from the floating gate core on the drain side of the transistor. Conversely, the absence of an inhibit mask on the source side results in a bird's beak encroachment 124 of the field oxide 126b. The thickness of the oxide of the bird's beak encroachment, between the buried source diffusion 118 and the floating gate core 100 discourages tunneling of electrons on the source side of the transistor. Naturally, this asymmetry could be reversed, so that the source side would provide a more likely path for a program and erase operations than the drain.

Array Architectures

Figure 2:
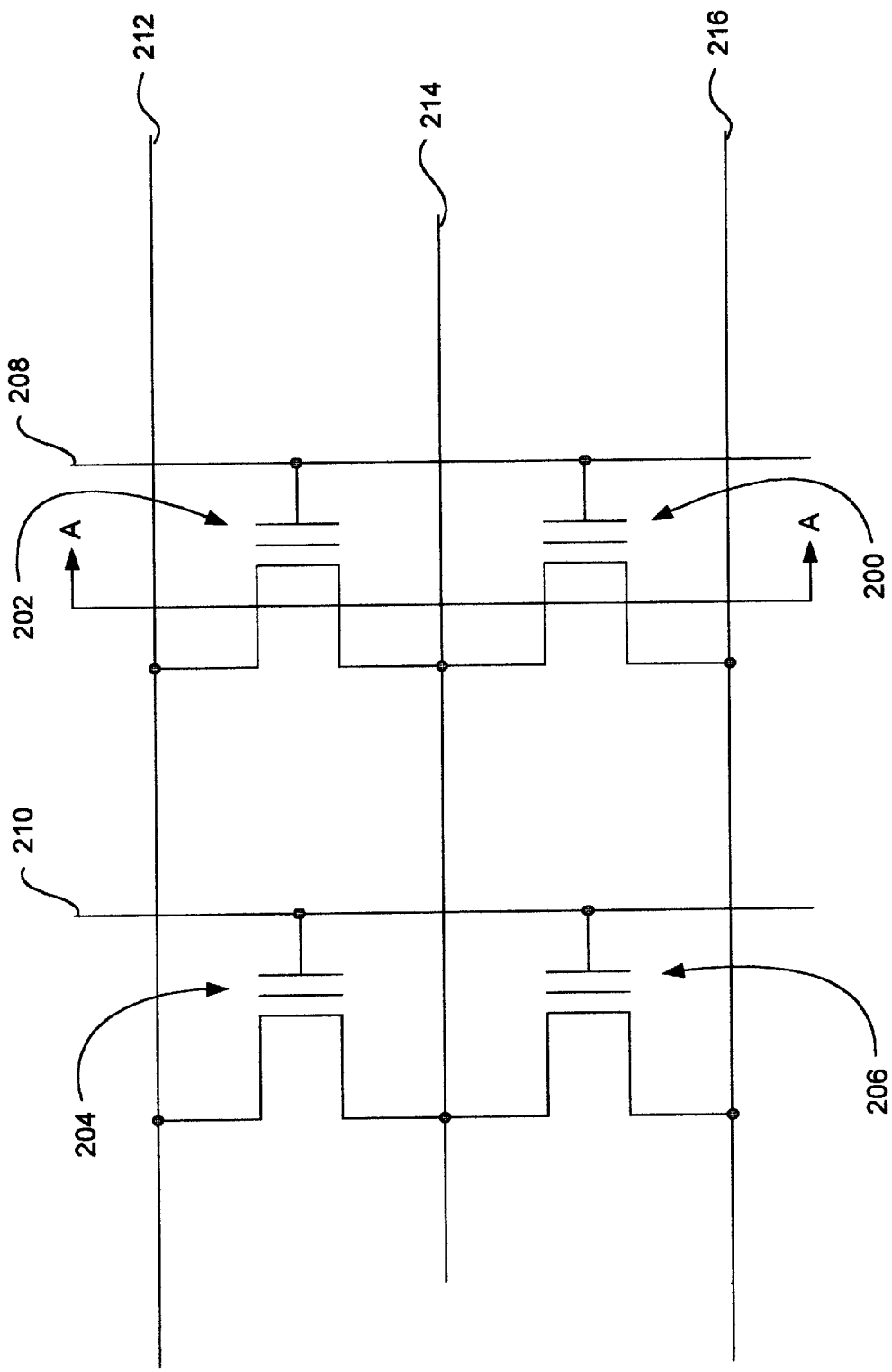
FIG. 2 is a circuit diagram of a memory array cell layout.

FIG. 2 is a schematic illustration of a memory array using the asymmetric bird's beak transistor of the current invention. A two-dimensional array of memory cells is formed by arranging floating gate transistors 200, 202, 204, 206 into rows and columns. As depicted in FIG. 2, a right column comprises transistor 200 and transistor 206. A left column comprises transistor 202 and transistor 204. The first row of the array comprises transistor 202 and transistor 200. The second row of the array comprises transistor 204 and transistor 206. The gates of transistors 200 and 202 are connected to word-line 208. The gates of transistors 204 and 206 are connected to word-line 210.

In a common ground architecture adjacent columns of memory cells share a bit-line with either the sources or drains of the transistors of the adjacent columns. In the common ground architecture the sources of transistors 200–206 are connected to a buried diffusion bit-line 214. The drains of transistors 202 and 204 are connected to drain bit-line 212. The drains of transistors 200 and 206 are connected to drain bit-line 216.

In a virtual ground architecture adjacent columns of memory cells share a bit-line with the sources of one and the drains of the other of the transistors of the adjacent columns. In the virtual ground architecture the sources of transistors 202–204 and the drains of transistors 200 and 206 are connected to a buried diffusion bit-line 214. The drains of transistors 202 and 204 are connected to bit-line 212. The sources of transistors 200 and 206 are connected to bit-line 216.

An X-Y addressing system is affected by word-lines 208 and 210 and the rows of memory cells they select on an X-axis and the bit-lines 212–216 and the columns of memory cells on a Y-axis. When a memory cell such as 202 is addressed, appropriate voltages must be passed onto its control gate, drain and source by the word-line 208 and bit-lines 212–214. In this instance, any cell in the array can be addressed individually for programming, erasure and read operations.

The asymmetric bird's beak transistor of the current invention is particularly advantageous in a memory array. It isolates and minimizes the disturb condition in a cell sharing a bit-line and a word-line with an adjacent cell which is being programmed or erased. As shown in FIG. 1, each asymmetric bird's beak transistor is configured so that tunneling takes place only at the drain side thereby preventing a disturb condition on a cell adjacent to one being programmed or erased. This cell structure may be used in either a common ground architecture or a virtual ground architecture to reduce the disturb problem. In the common ground architecture the disturb problem that arises that will be described in greater detail is called a source disturb. In the virtual ground architecture the disturb problem that arises that will be described in greater detail is called a program disturb.

It will be evident to one skilled in the art that the asymmetric bird's beak transistor and method for fabricating the same which are disclosed in this application may be used with equal advantage in either architecture.

Source Disturb

The terminology "source disturb" refers to an increase in floating gate charge and therefore possible corruption of the bit stored in memory, resulting from the programming of an adjacent cell. When, for example, transistor 202 is to be programmed, a negative voltage is placed on word-line 208. Bit-line 212 which is connected to the drain of transistor 202 is placed at a high voltage and bit-lines 214 and 216 are floating. Under these conditions, electrons are removed from the floating gate of transistor 202 to the drain bit-line 212. If transistor 204 which shares a bit-line with transistor 202 happens to have a low $V_t$, then the high drain voltage on bit-line 212 can couple to the floating gate of transistor 204, thereby creating a positive voltage condition on source bit-line 214. Transistor 200 has a gate which is in the same negative voltage condition as the gate of transistor 202. Both these transistors are connected to word-line 208 which is in a negative voltage state during programming. Under these conditions, once source bit-line 214 takes on a positive voltage characteristic, electrons may be encouraged to tunnel from the floating gate of transistor 200 to the source bit-line 214. If this is the case, a disturbed condition has resulted. Sufficient charge may have been removed from the floating gate of transistor 200 to alter the logic state corresponding to the amount of charge stored on transistor 200. The present invention provides an architecture and method for fabrication which reduces the potential for a source disturb.

Program Disturb

The terminology "program disturb" refers to an increase in floating gate charge and, therefore, possible corruption of the bit stored in memory, resulting from the programming of an adjacent cell. When, for example, transistor 200 is to be programmed, a negative voltage is placed on word-line 208. Bit-line 214 which is connected to the drain of transistor 200 is placed at a positive voltage and bit-lines 212 and 216 are floating. Under these conditions, electrons are removed from the floating gate of transistor 200 to the bit-line 214. The control gate of transistor 202 and transistor 200 are both connected to word-line 208. Therefore, during the programming of transistor 200 the control gate of transistor 202 is also placed in a negative voltage condition. In addition, the source of transistor 202 is connected to bit-line 214 and is therefore placed in a positive voltage condition. If the source of transistor 202 provides a favorable path for electron tunneling by a FN mechanism then electrons will be removed from the floating gate of transistor 202 during the programming of memory cell 200. If sufficient charge is removed from the floating gate of transistor 202 to alter the logic state corresponding to the amount of charge stored on transistor 202, due to a program disturb condition, then an error occurs. However, due to the drain junction which maximizes electron tunneling and the source junction which minimizes electron tunneling the present cell structure reduces the program disturb problem.

SiO$_2$ Formation

Figure 3A:
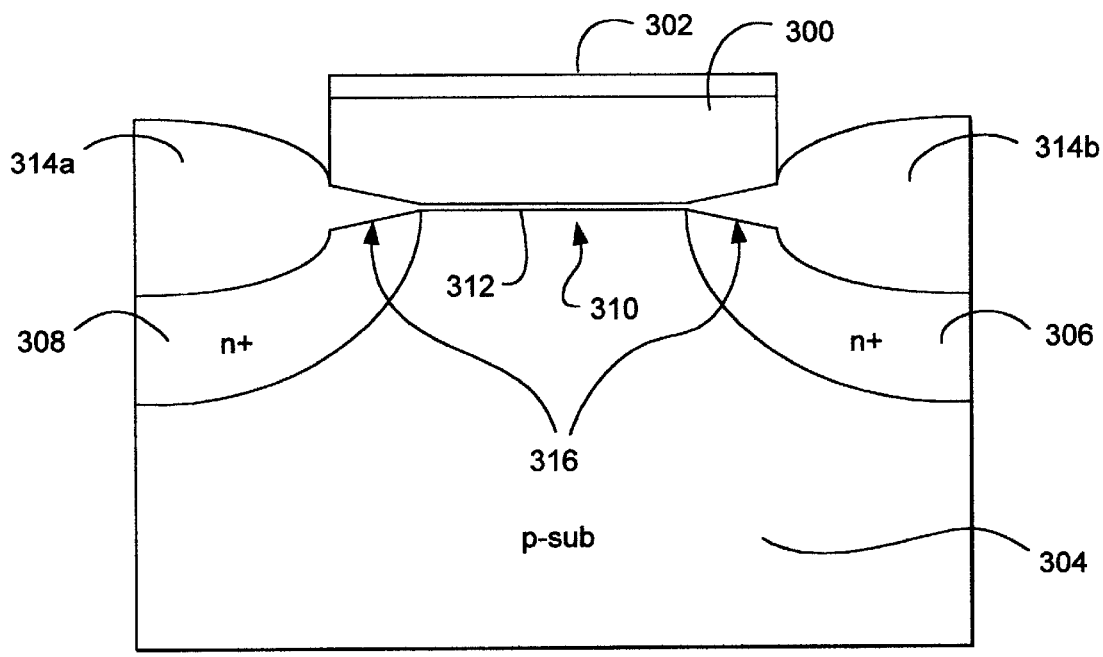
FIGS. 3A–B are cross-sectional elevation views illustrating conventional oxide formation techniques.
Figure 3B:
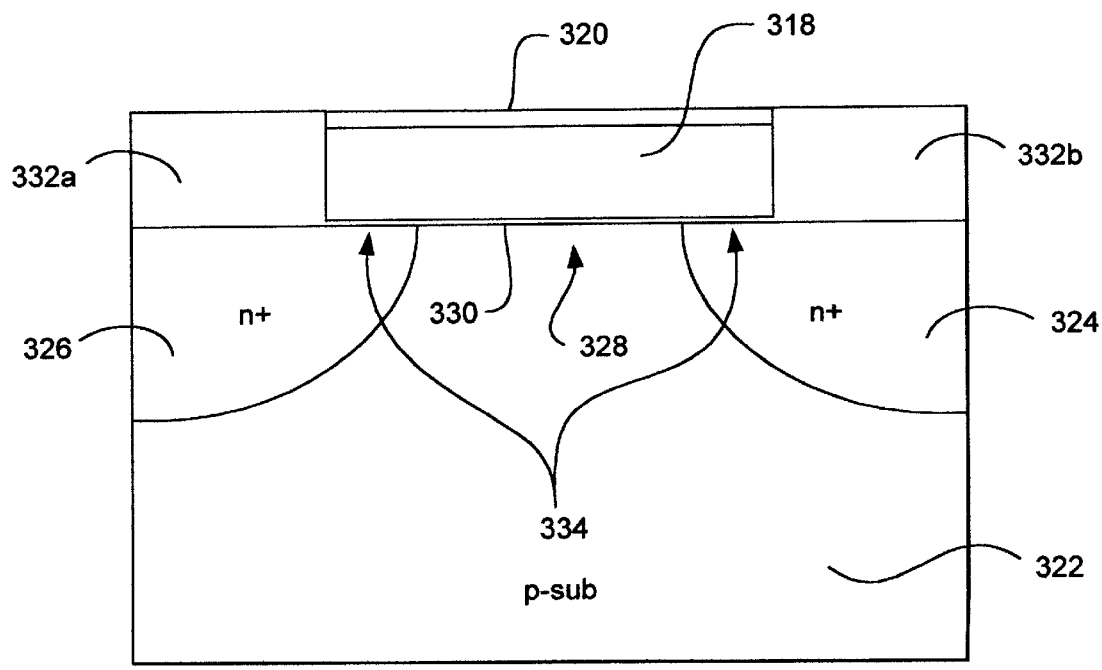

FIGS. 3A–B are cross sectional views showing two conventional formation techniques for silicon oxide. FIG. 3A depicts formation of silicon oxide by thermal oxidation in which silicon is exposed to an oxidizing ambient (O$_2$, H$_2$O) at elevated temperatures. Thermal oxidation can produce SiO$_2$ films with controlled thickness and interface properties. FIG. 3B depicts formation of silicon oxide by chemical vapor deposition (CVD).

FIG. 3A is a partial cross sectional view of a floating gate cell. Floating gate core 300 is positioned above p-type substrate 304 and is covered with a nitride cap 302. The floating gate core is separated from the substrate by a thin dielectric 312. In the substrate, a buried n$^+$ source diffusion 306 and a buried n$^+$ drain diffusion 308 define between them a channel region 310 beneath the floating gate core. A thermally grown field oxide 314a–b is shown on both the source side and drain side of the core 300. Formation of silicon dioxide by thermal means involves an increase in the density as oxygen combines with silicon to form SiO$_2$. As the oxide grows silicon is consumed and the interface moves into the silicon. As shown in FIG. 3A, this expansion process results in birds' beaks 316 on both the source and the drain side of floating gate core 300. A thicker oxide separating the source and drain from the core results in less efficient and slower transport of electrons to and from a floating gate core.

FIG. 3B is a partial cross-section of a transistor in which a field oxide has been formed by a chemical vapor deposition (CVD) process. CVD silicon dioxide may have lower density and different stoichiometry from thermal silicon dioxide causing changes in mechanical and electrical film properties. Floating gate core 318 is formed on p-type substrate 322. The floating gate core is shown with a nitride cap 320. The floating gate core is separated from the substrate by a thin dielectric 330. In the substrate, buried n$^+$ source diffusion 324 and buried n$^+$ drain diffusion 326 define between them a channel 328 beneath the floating gate core. The field oxide 332a–b is formed by a CVD process. The CVD process is characterized by deposition, as opposed to the growth process associated with thermal formation. Uniform thin tunneling regions 334 exist on both the source and drain sides of floating gate core 318. Either tunneling regions provide a high speed path for migration of electrons from the source or drain to the floating gate core 318.

Initial Manufacturing Steps for an Asymmetric Bird's Beak Transistor

FIGS. 4–5 and 6A–11A are cross-sectional views taken at FIG. 2(A—A) of a preferred embodiment for the manufacturing steps of an asymmetric bird's beak transistor used in a common ground architecture. FIGS. 4–5 and 6B–11B are cross-sectional views taken at FIG. 2(A—A) of a preferred embodiment for the manufacturing steps of an asymmetric bird's beak transistor used in a virtual ground architecture. The manufacturing techniques result in a cell which has a high speed tunneling region on one of the source or drain sides of the cell and a bird's beak encroachment on the other side of the cell. The cell produced by this process therefore has high program speed and yet is resistant to a disturb condition.

Figure 4:
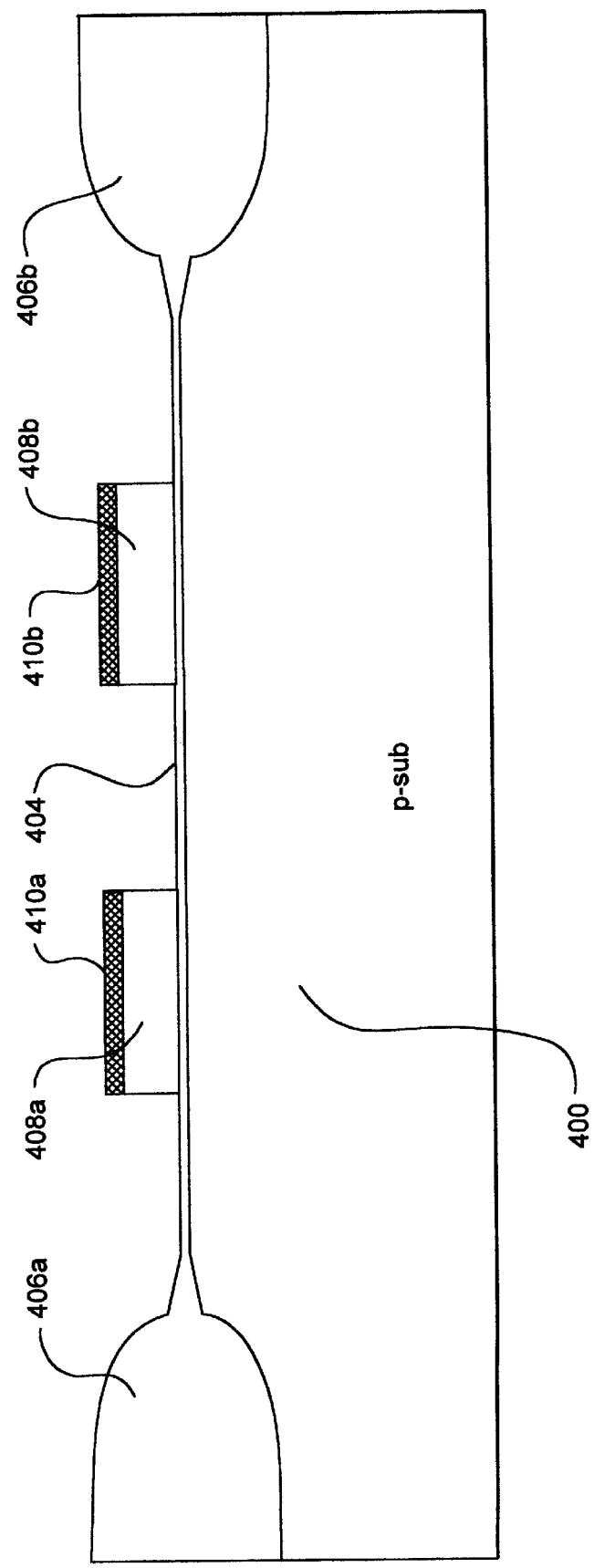
FIGS. 4–5 are cross-sectional elevation views taken at FIG. 2 (A—A) and illustrating the initial steps in the manufacture of memory cells having an asymmetric bird's beak source and drain and suitable for use in either a common or virtual ground architecture.
Figure 5:
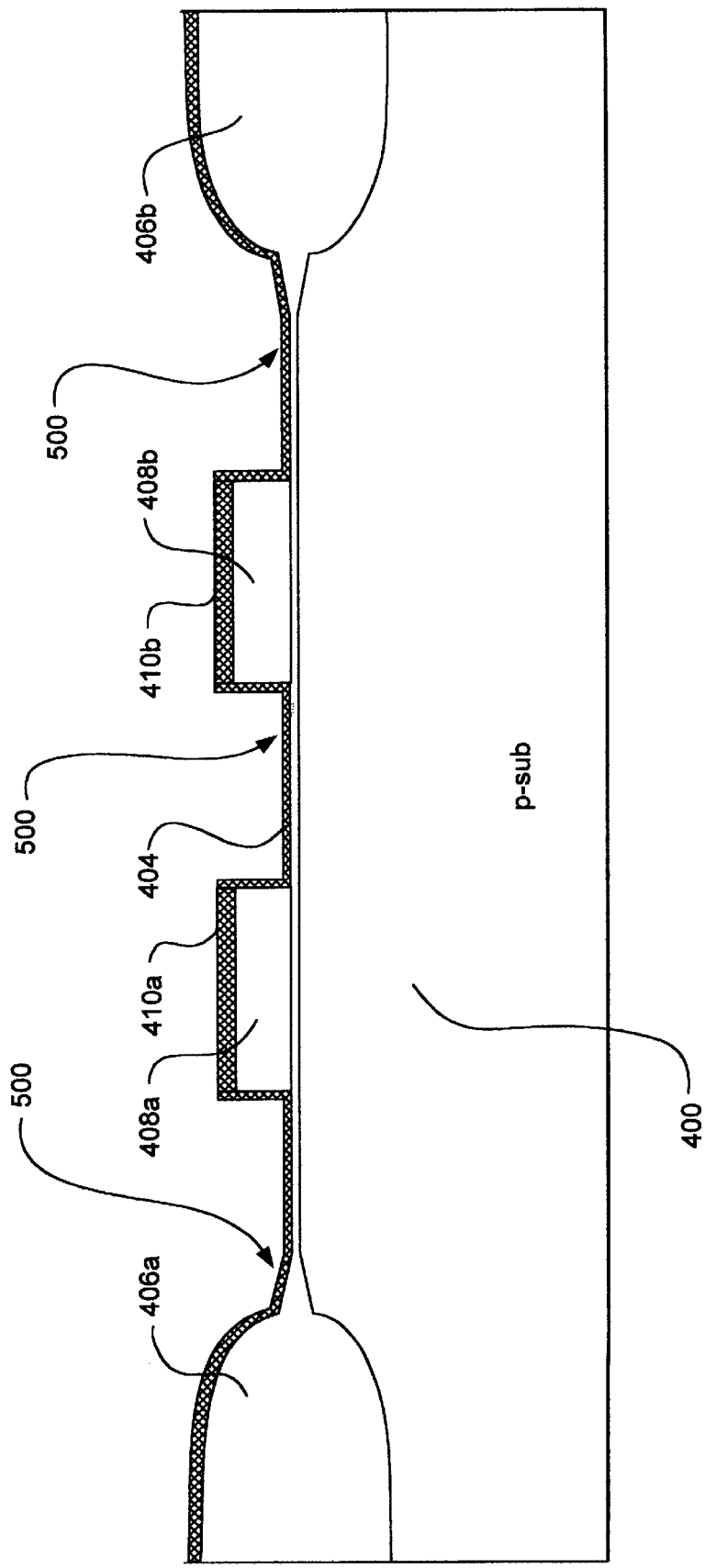

The cell is fabricated using a 0.5 micron CMOS double metal, double well (one well in the array, a second well for the peripheral circuitry), and double poly technology, as is well known to those skilled in the art. FIG. 4–5 illustrates the initial formation steps which are common to either the common ground or virtual ground architectures. As shown in FIG. 4, after a $V_t$ adjustment a tunneling silicon-oxide 404 flanked by field oxide regions 406a–b is formed on the surface of the p type substrate 400. Next, a poly silicon layer is deposited on the oxide. Then a silicon nitride layer 400–500Å in thickness is deposited. The structure is masked and patterned to define poly silicon floating gate strips 408a–b and respective silicon nitride caps 410a–b.

As shown in FIG. 5, a thin silicon nitride layer 500 approximately 100Å is deposited on caps 410a–b, tunneling silicon-oxide 404 and field oxide 406a–b. This nitride needs to be much thinner than caps 410a–b so that in the subsequent etching steps patterned regions of the tunneling silicon-oxide 404 can be exposed without exposing the polysilicon floating gate strips 408a–b.

Manufacturing Steps specific to Common and Virtual Ground Architectures

Figure 6A:
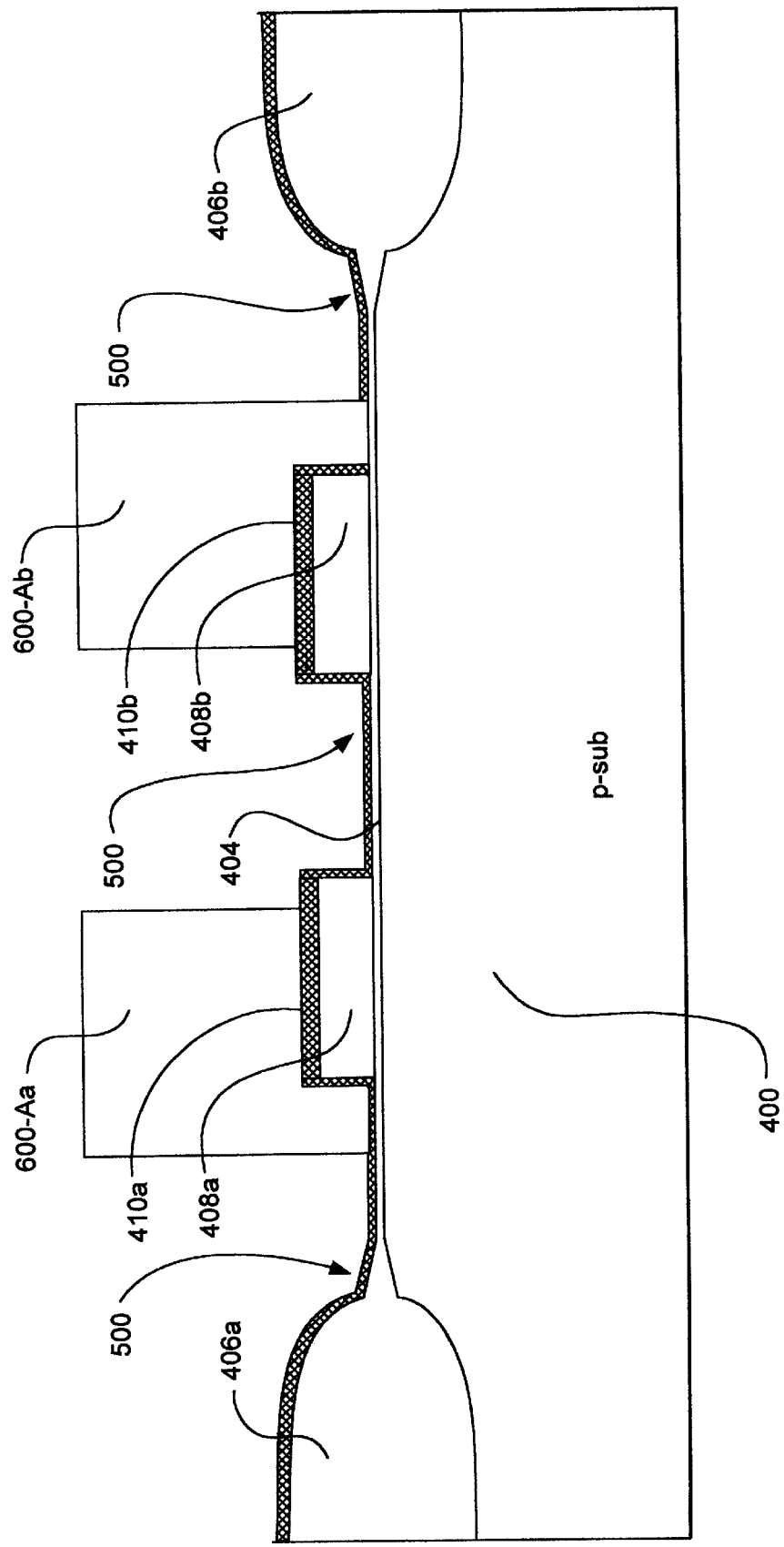

In FIG. 6A the masking placement suitable for a common ground architecture is shown. Photo-resist masks 600-Aa–Ab have been placed over the drain side of the floating gate strips 408a–b. In the common ground architecture the drains are on opposite sides of their corresponding floating gate strip. Mask 600-Aa covers the drain side of the floating gate core 408a. Mask 600-Ab covers the drain side of floating gate core 408b.

Figure 6B:
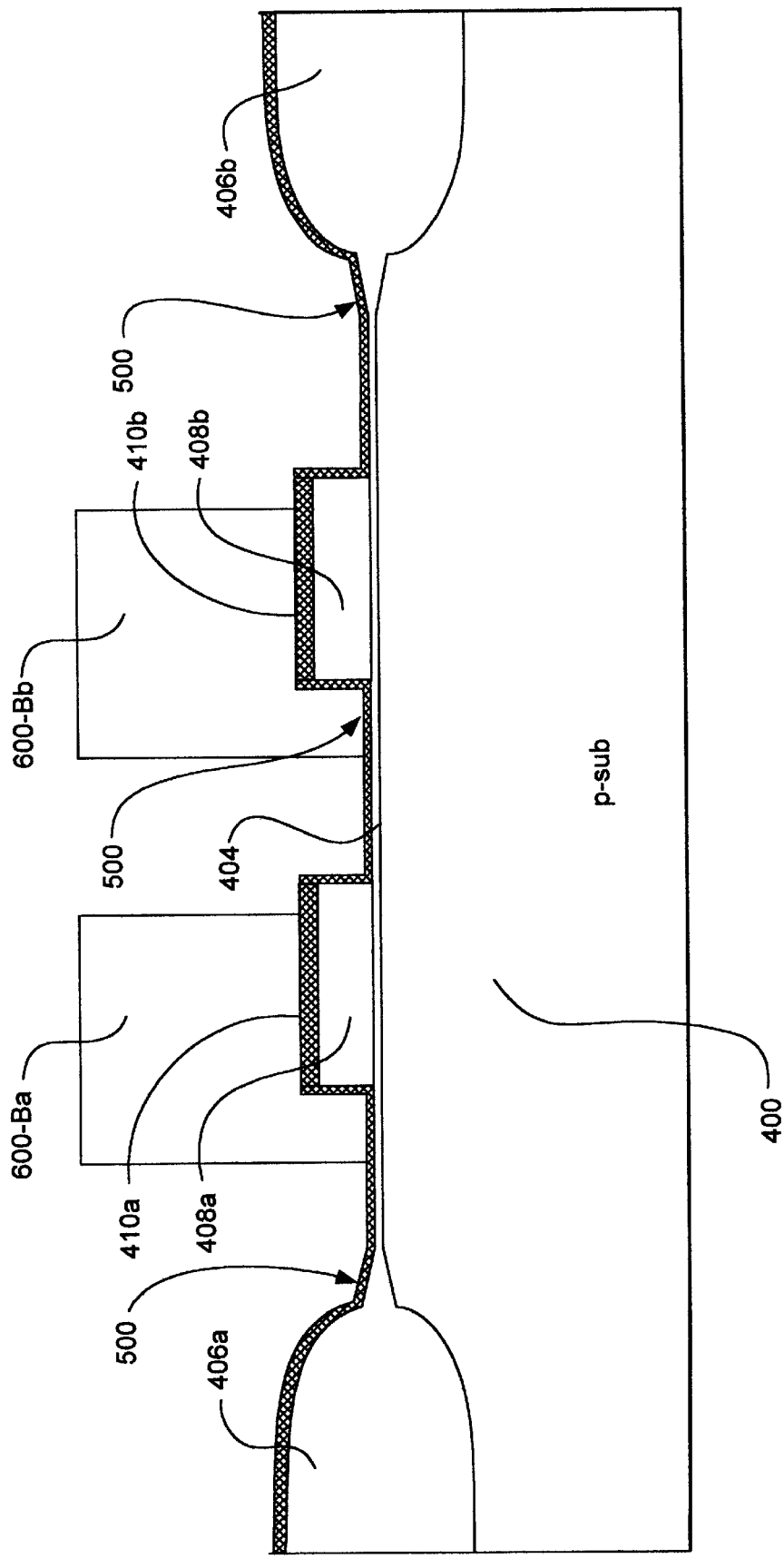

In FIG. 6B the masking placement suitable for a virtual ground architecture is shown. Photo-resist masks 600-Ba–Bb have been placed over the drain side of the floating gate cores 408a–b. In the virtual ground architecture the drains are on the same sides of their corresponding floating gate strip. Mask 600-Ba covers the drain side of the floating gate core 408a. Mask 600-Bb covers the drain side of floating gate core 408b.

Manufacturing Steps shared by Common and Virtual Ground Architectures

The manufacturing steps that follow are similar for common and virtual ground architectures. The "A" series of figures shows the steps for the common ground architecture. The "B" series of figures shows the steps for the virtual ground architecture. They differ only in the location of the inhibit masks. That location is determined in the masking step discussed in connection with FIGS. 6A–B.

Figure 7A:
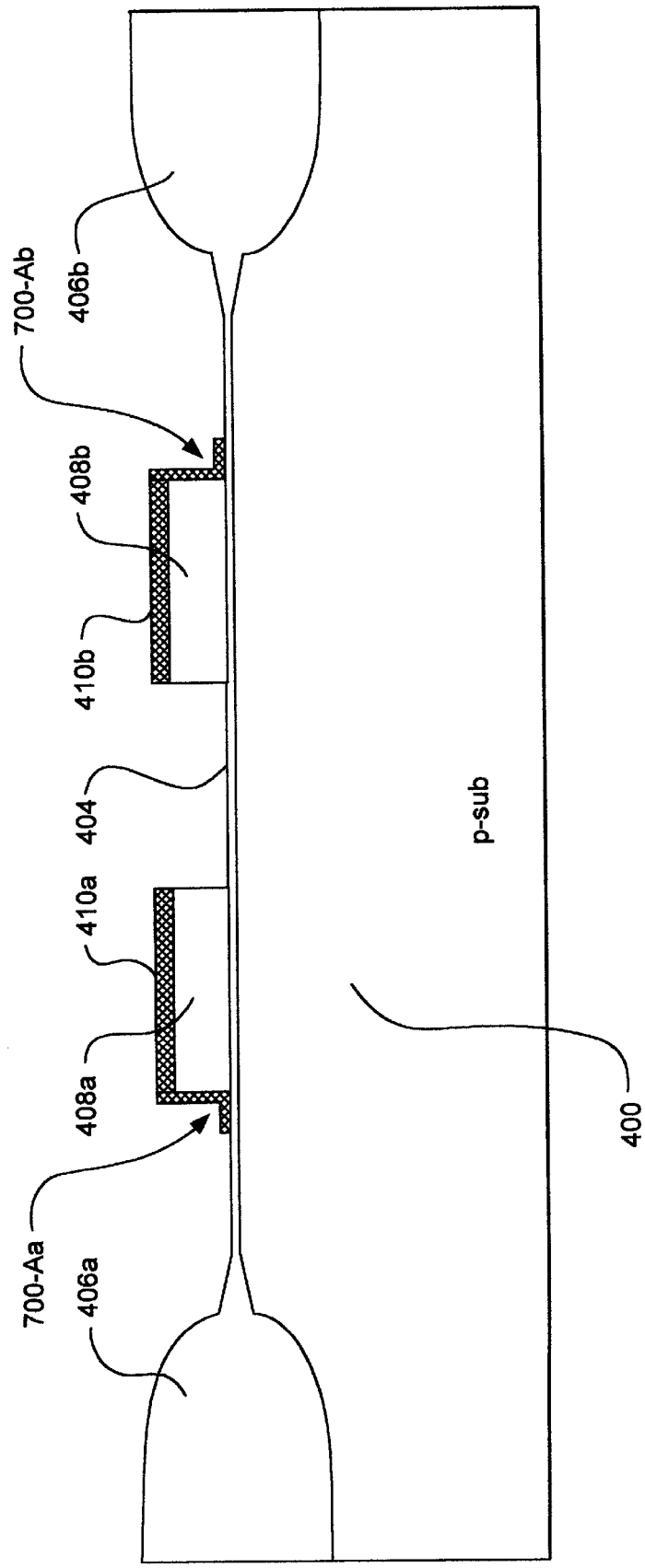
Figure 7B:
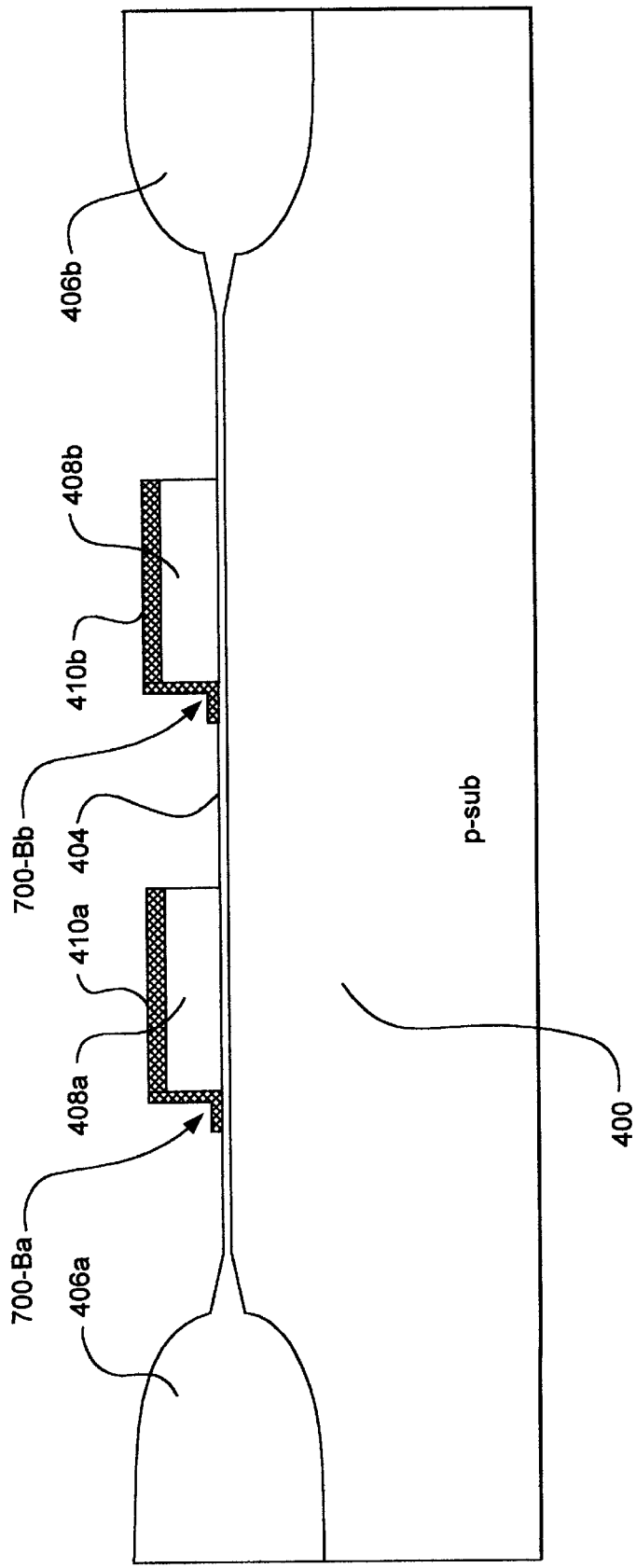

In FIGS. 7A–B, the exposed portions of the silicon nitride layer 500 have been etched back and photo-resist masks have been removed. In FIG. 7A, the photo-resist masks 600-Aa–b have been removed. Nitride inhibit mask 700-Aa covers the drain region adjacent floating gate strip 408a, and nitride inhibit mask 700-Ab covers the drain region adjacent floating gate strip 408b. In FIG. 7B the photo-resist masks 600-Ba–Bb have been removed. Nitride inhibit mask 700-Ba covers the drain region adjacent floating gate strip 408a, and nitride inhibit mask 700-Bb covers the drain region adjacent floating gate strip 408b.

Figure 8A:
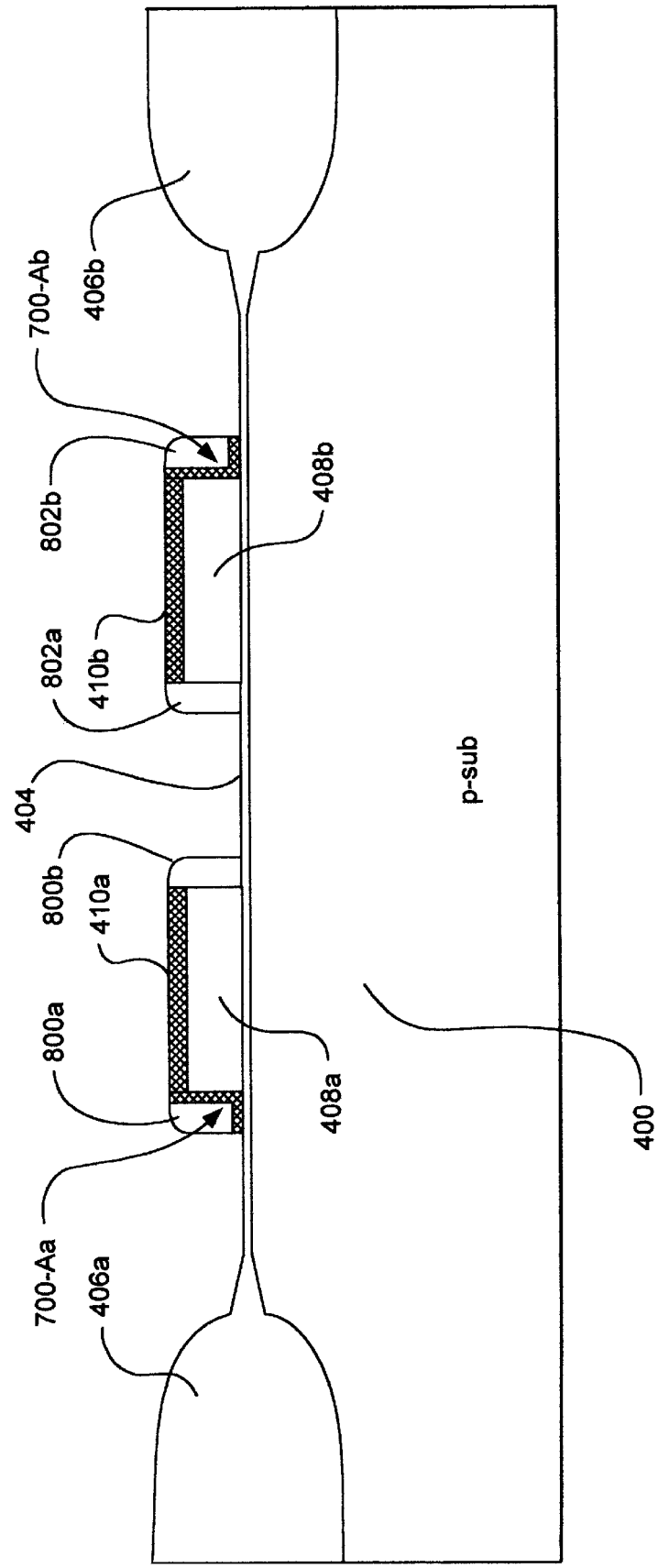
Figure 8B:
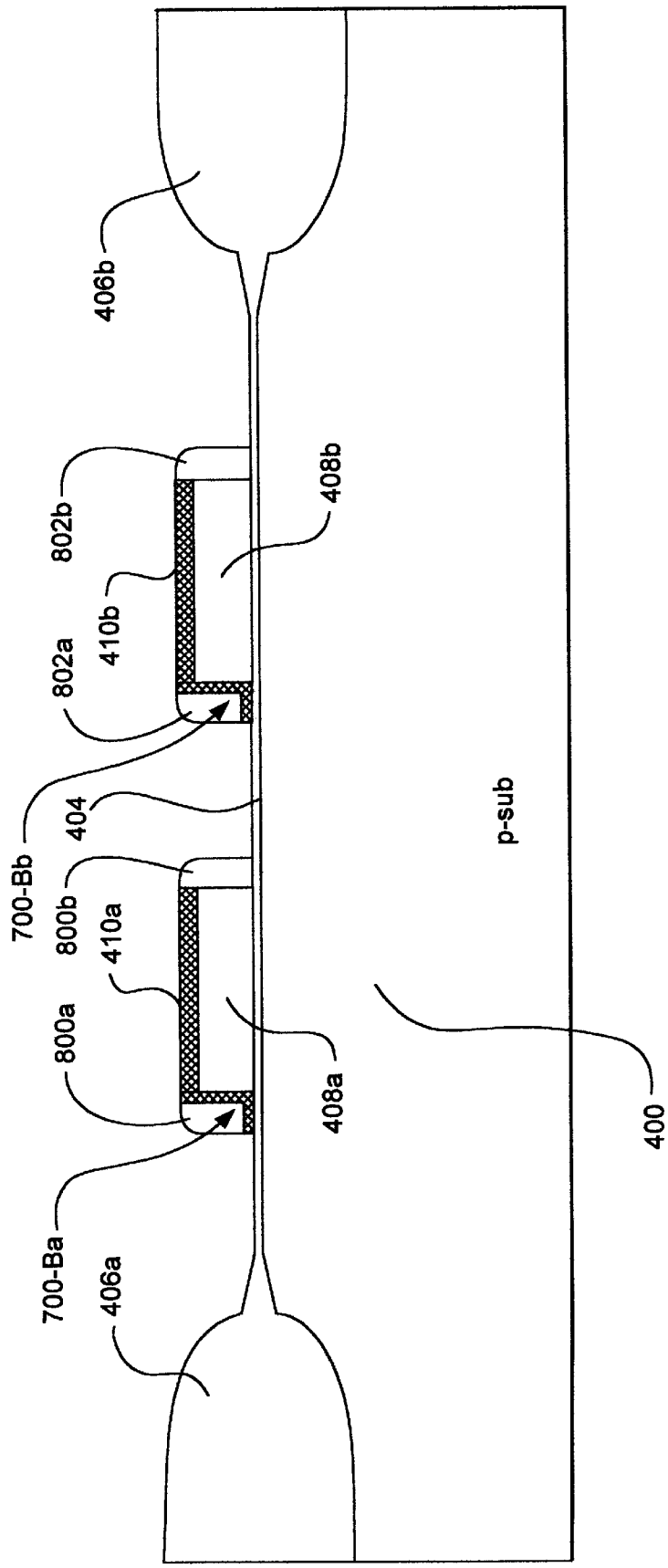

In FIGS. 8A–B, sidewalls 800a–b and 802a–b have been formed adjacent to the floating gate strips 408a and 408b, respectively. The formation process involves the CVD deposition of an oxide layer having a thickness corresponding to the desired width of the sidewalls. Subsequently, an anisotropic etchback produces the sidewalls 800a–b and 802a–b. In FIG. 8A, the common ground architecture, sidewalls 800a and 802b cover the nitride inhibit masks 700-Aa and 700-Ab, respectively, on the drain side of floating gate strips 408a and 408b, respectively. In FIG. 8B, the virtual ground architecture, sidewalls 800a and 802a cover the nitride inhibit masks 700-Ba and 700-Bb, respectively, on the drain side of floating gate strips 408a and 408b, respectively.

Figure 9A:
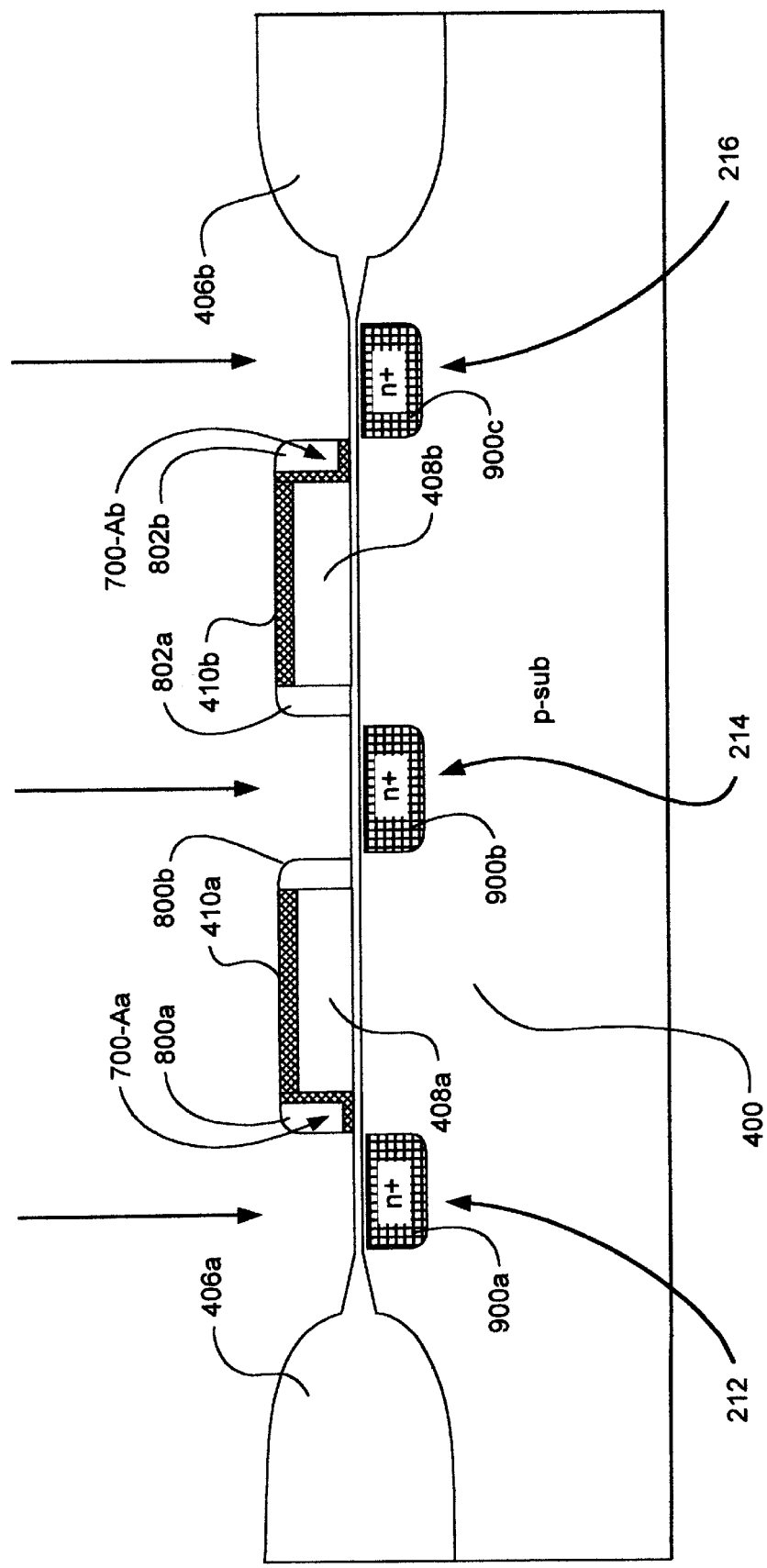
Figure 9B:
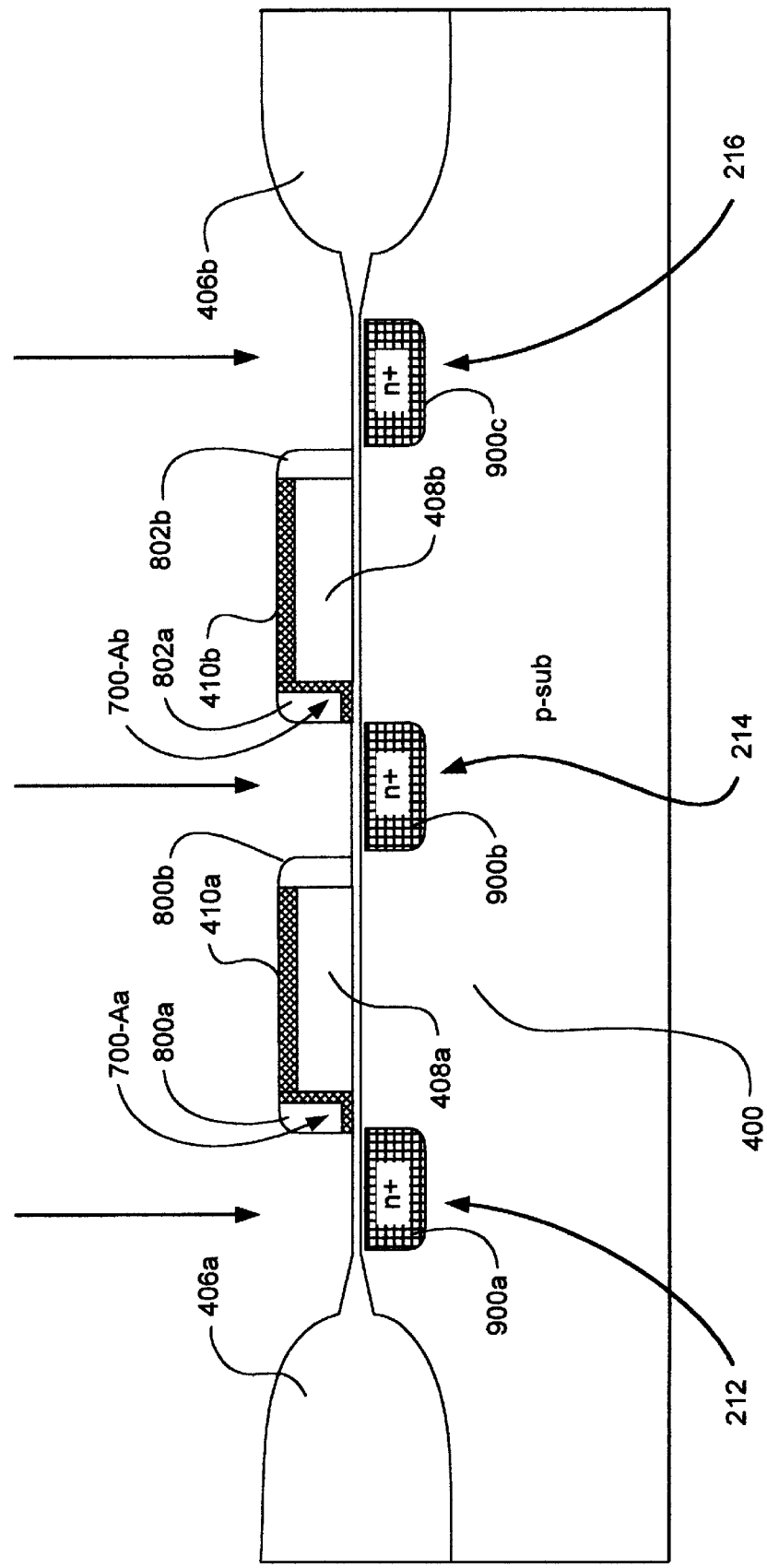

In FIGS. 9A–B, a n$^+$ dopant implant is shown. In FIG. 9A, showing the common ground architecture, a n$^+$ dopant implant 900b forms buried bit-line 214 shown in FIG. 2. This buried bit-line connects the sources of floating gate strips 408a–b. A n$^+$ dopant implants 900a,c form buried bit-lines 212 and 216, respectively. Buried bit-line 212 is connected to the drain of floating gate strip 408a. Buried bit-line 216 is connected to the drain of floating gate strip 408b. In FIG. 9B, showing the virtual ground architecture, the n$^+$ dopant implant 900b forms buried bit-line 214. This buried bit-line connects the source and drain of floating gate strips 408a–b, respectively. The n$^+$ dopant implants 900a,c form buried bit-lines 212 and 216, respectively. Buried bit-line 212 is connected to the drain of floating gate strip 408a. Buried bit-line 216 is connected to the source of floating gate strip 408b.

Figure 10A:
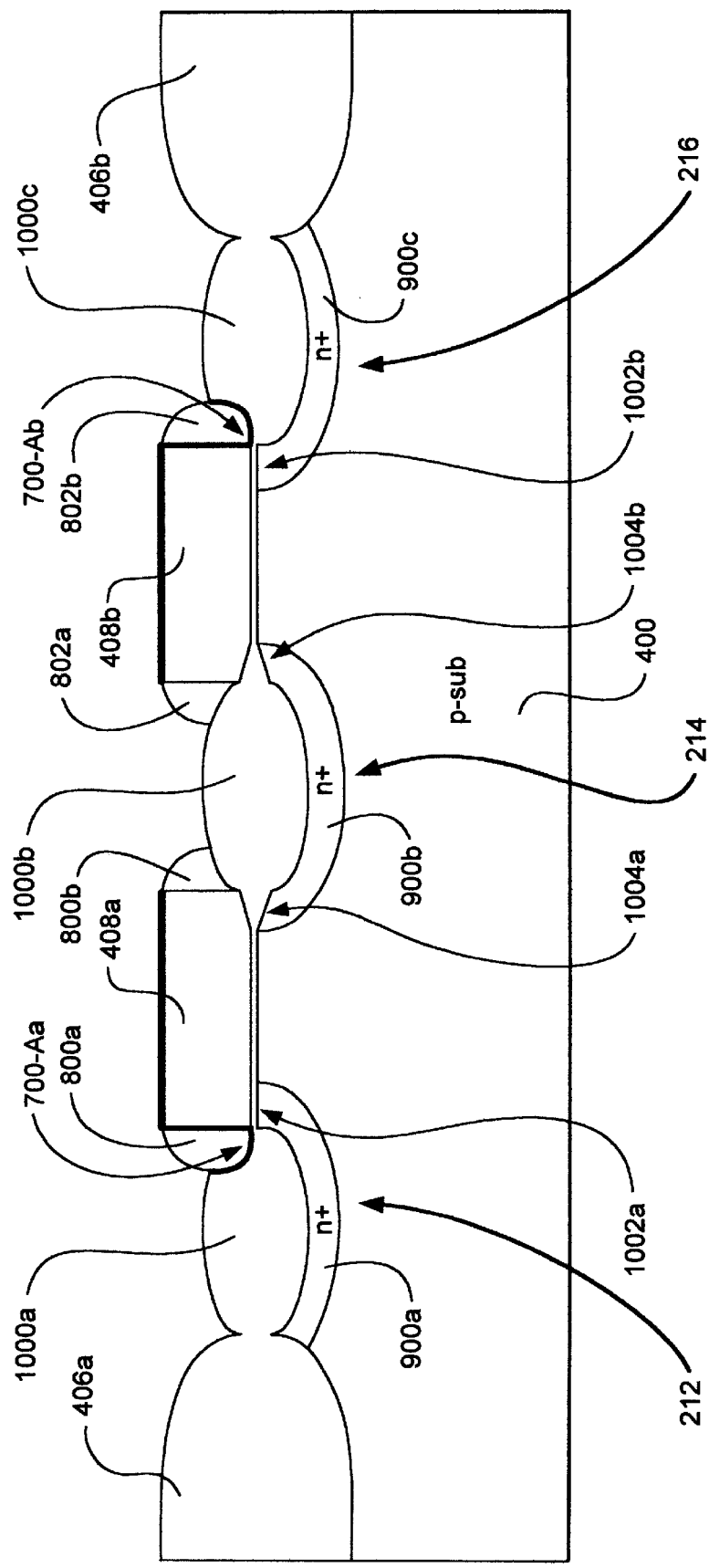
Figure 10B:
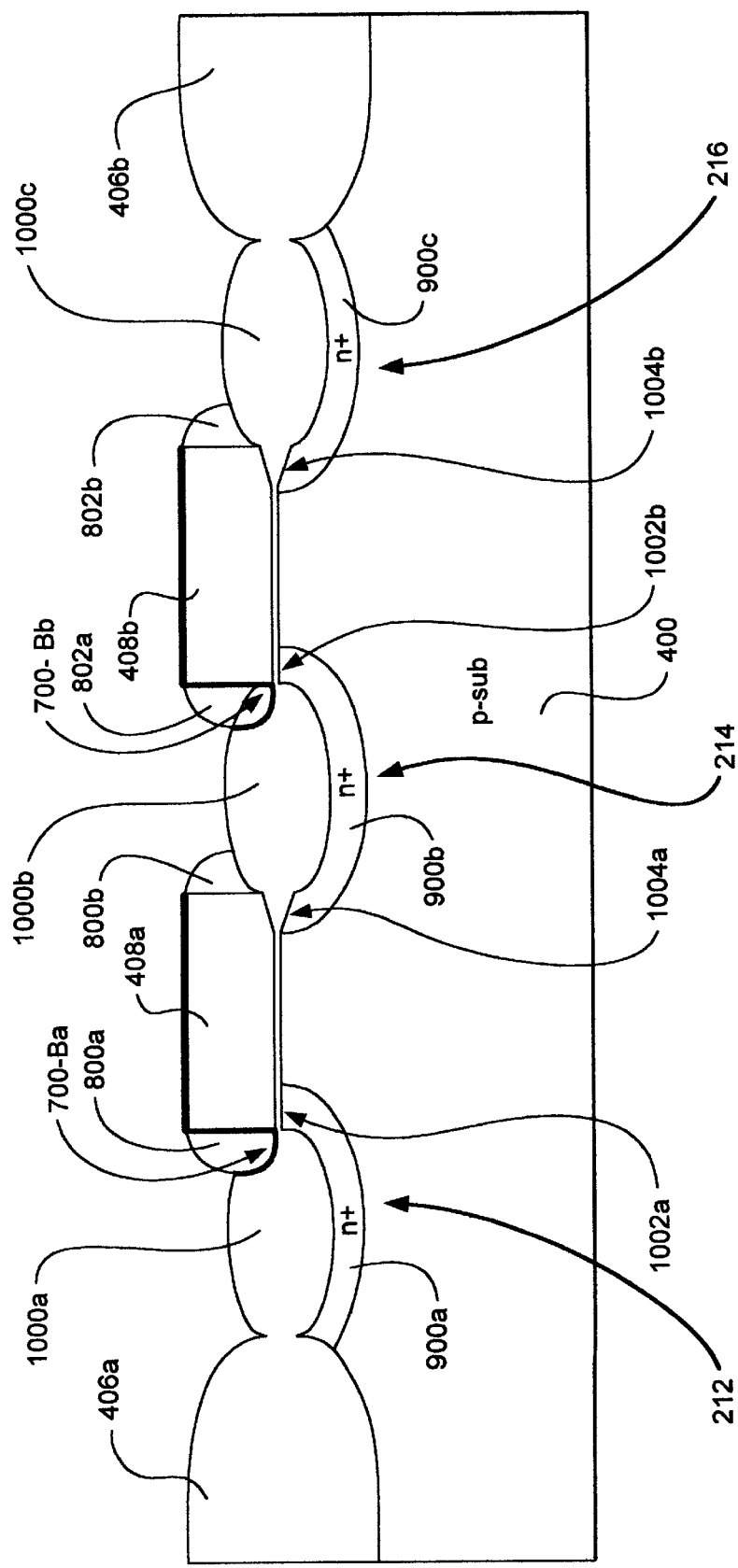

In FIGS. 10A–B, a thermal oxidation of the exposed portions of tunneling silicon-oxide 404 is performed. As a result, thermal oxide regions 1000a,b,c have been formed over buried diffusions 900a,b,c respectively. As is apparent from the drawing, only the side of the floating gate strips 408a–b that is not protected with an inhibit mask has birds' beak encroachments. Thermal oxide encroachment regions 1004a–b reference birds' beak encroachments below the floating gate strips 408a–b, respectively. These encroachments result in a thicker oxide layer between the buried n$^+$ diffusion bit-line(s) and floating gate strips 408a–b. The thicker oxide slows electron flow and reduces the source disturb problem. A corresponding encroachment is not present on the drain side of floating gate strips 408a or 408b. The tunneling regions 1002a and 1002b provide high speed tunneling paths between floating gate strip 408a–b and the buried diffusion(s). This asymmetric structure, as between source and drain of each transistor/cell, is a result of the nitride inhibit masks 700-Aa–b shown in FIG. 10A and 700-Ba–b shown in FIG. 10B. The nitride inhibit masks cover the drain side of floating gate strips 408a–b and prevent oxidation. Silicon nitride is useful as a masking layer for selective oxidation. Silicon nitride itself oxidizes very slowly and is not penetrated by oxygen. As a result, silicon nitride protects the underlying Si from oxidizing while allowing a thermal SiO$_2$ layer to grow on thermal oxide regions 1000a–c.

Figure 11A:
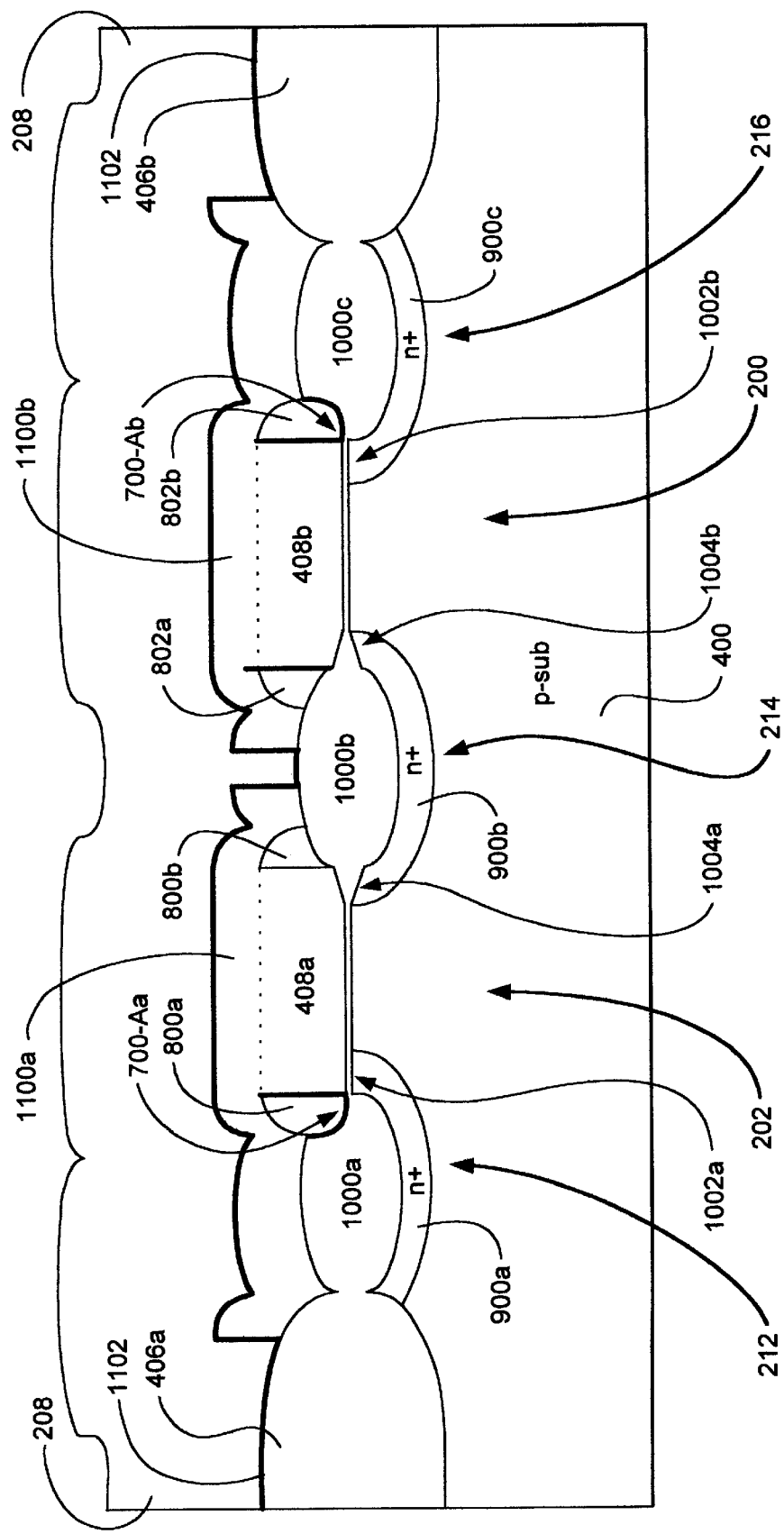
Figure 11B:
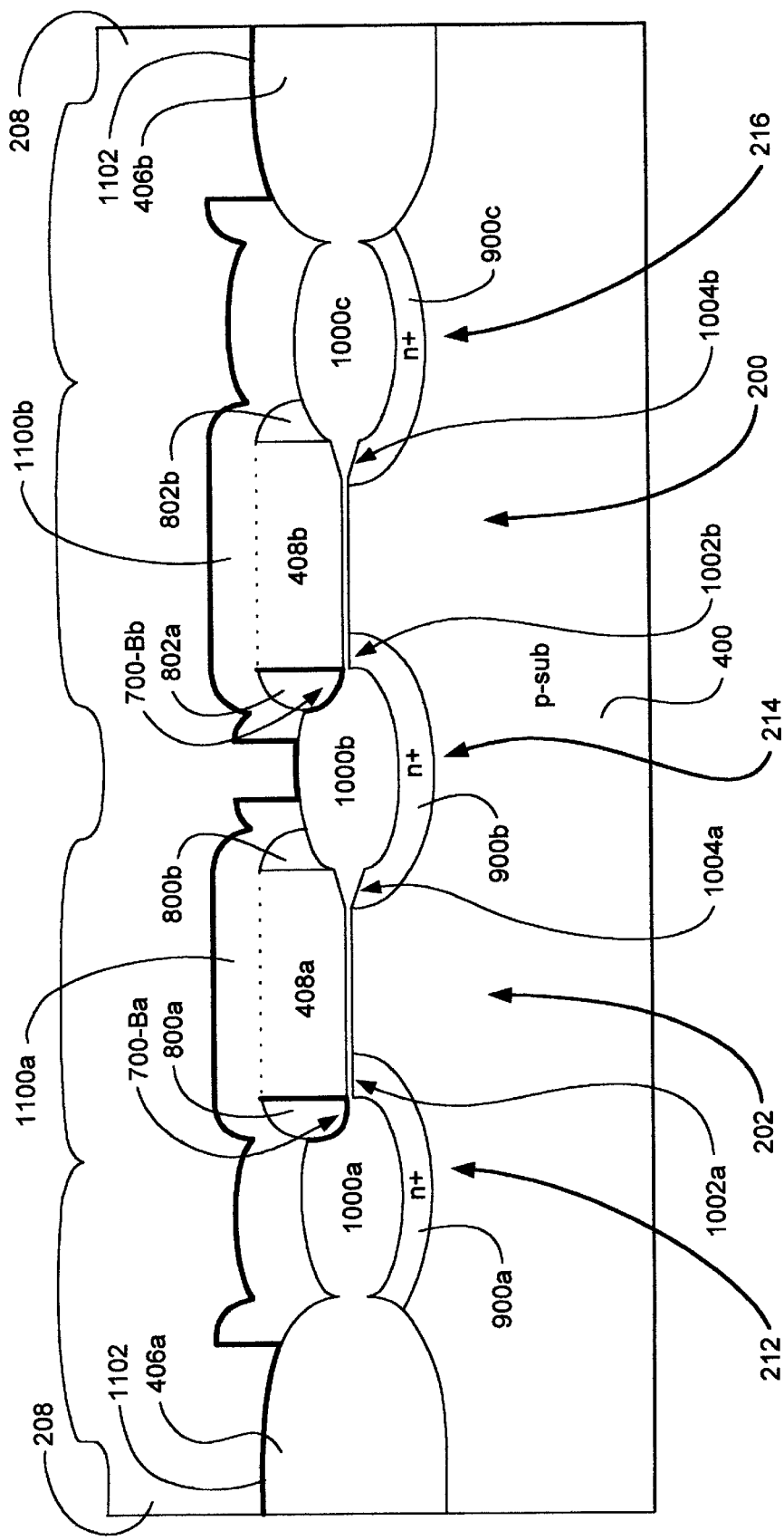

As shown in FIGS. 11A–B, the formation of the memory cells comprising transistors, 200–202 is completed. Floating gate coupling caps, 1100a–b comprising polysilicon are deposited above transistors 202 and 200, respectively. Specifically floating gate coupling cap 1100a covers floating gate strip 408a and sidewalls 800a–b. Floating gate coupling cap 1100b covers floating gate strip 408b and sidewalls 802a–b. Each coupling cap increases the gate coupling ratio of the transistors 202 and 200. An interpoly dielectric 1102, e.g., oxide-nitrite-oxide (ONO) covers the floating gate coupling caps and insulates them from the polysilicon layer. The polysilicon layer and floating gate strips are patterned and etched to form word-line 208 and floating gate cores 408a–b, respectively. Bit-lines 212, 214, and 216 are formed from buried n$^+$ diffusions 900a–c, respectively. The formation of the memory array is completed with the connection of a row select circuit to the word-line(s). A column select circuit and sense amplifier are connected to the buried bit-lines 212–216. The selection circuitry gates current to a word-line and a selected pair of the buried diffusion bit-lines to program, erase, and read a selected floating gate transistor.

As described above, according to the asymmetric bird's beak transistor and manufacturing method therefore of this invention, memory cells can be formed with high density, high programming speed and without a source or programming disturb.

The foregoing description of a preferred embodiment of the invention has been presented for purposes of illustration and description. It is not intended to limit the invention to the precise forms disclosed. Obviously many modifications and equivalent arrangements will be apparent to practitioners skilled in this art. Therefore, persons of ordinary skill in this field are to understand that all such equivalent structures are to be included within the scope of the following claims and their legal equivalents.

What is claimed is:

1. A method for manufacturing an asymmetric bird's beak encroachment in a nonvolatile memory cell array, the method comprising the steps of:

forming a dielectric covering a semiconductor substrate of a first conductivity type;

forming a column of floating gates, having a first and a second side, on said dielectric;

forming an inhibit mask adjacent only said first side of said column of floating gates;

forming sidewalls adjacent the first side and the second side of said column of floating gates:

implanting a dopant in regions of the semiconductor substrate adjacent said sidewalls, said dopant having a second conductivity type opposite said first conductivity type;

forming a thermal oxide adjacent said first and said second side of said column of floating gates and said regions adjacent said first side of said column of floating gates separated from said floating gates by said dielectric and said regions adjacent said second side of said column or floating gates separated from said floating gates by a bird's beak encroachment of said thermal oxide formation; forming a control gate dielectric on the floating gates; and forming control gates on the control gate dielectric.

2. The method of claim 1, comprising the step of providing a dielectric material for said inhibit mask.

3. The method of claim 2, wherein:

said step of forming said inhibit mask, further comprises:

forming a nitride layer on said column of floating gates and said dielectric; and patterning a mask over said nitride layer adjacent said first side of said column of floating gates;

removing said nitride layer to expose said dielectric on said second side of said column of floating gates; and removing said patterned mask to expose said inhibit mask adjacent said first side of said column of floating gates.

4. The method of claim 2, further comprising the steps of:

providing a layer of silicon nitride to form said inhibit mask;

using silicon oxide for said dielectric;

implanting a p-type material in a portion of said semiconductor substrate to provide said first conductivity type;

implanting a portion of said substrate with an n-type material to form said second conductivity type; and providing a layer of polysilicon to form said column of floating gates.

* * * * *